(12) United States Patent
Abe

(10) Patent No.: US 8,262,940 B2
(45) Date of Patent: Sep. 11, 2012

(54) COATED CONDUCTIVE POWDER AND CONDUCTIVE ADHESIVE USING THE SAME

(75) Inventor: Shinji Abe, Tokyo (JP)

(73) Assignee: Nippon Chemical Industrial Co., Ltd., Tokyo (JP)

( * ) Notice: Subject to any disclaimer, the term of this patent is extended or adjusted under 35 U.S.C. 154(b) by 191 days.

(21) Appl. No.: 12/738,017

(22) PCT Filed: Oct. 21, 2008

(86) PCT No.: PCT/JP2008/069067
§ 371 (c)(1),
(2), (4) Date: Apr. 14, 2010

(87) PCT Pub. No.: WO2009/054386
PCT Pub. Date: Apr. 30, 2009

(65) Prior Publication Data
US 2010/0219382 A1    Sep. 2, 2010

(30) Foreign Application Priority Data
Oct. 22, 2007   (JP) .................................. 2007-273550

(51) Int. Cl.
*H01B 1/00* (2006.01)
(52) U.S. Cl. ....................................... 252/500; 428/403
(58) Field of Classification Search ................... 252/500; 428/403
See application file for complete search history.

(56) References Cited

U.S. PATENT DOCUMENTS

| | | |
|---|---|---|
| 2001/0004857 A1 | 6/2001 | Sasaki |
| 2006/0154070 A1 | 7/2006 | Wakiya et al. |
| 2006/0263581 A1 | 11/2006 | Park et al. |
| 2007/0059503 A1 | 3/2007 | Park et al. |

FOREIGN PATENT DOCUMENTS

| | | |
|---|---|---|
| JP | 1-116083 A | 5/1989 |
| JP | 2-15176 A | 1/1990 |
| JP | 3-112011 A | 5/1991 |
| JP | 4-259766 A | 9/1992 |
| JP | 7-118617 A | 5/1995 |
| JP | 2000-315422 A | 11/2000 |

(Continued)

OTHER PUBLICATIONS

International Search Report of PCT/JP2008/069067, mailing date of Feb. 24, 2009.

*Primary Examiner* — Khanh Tuan Nguyen
(74) *Attorney, Agent, or Firm* — Westerman, Hattori, Daniels & Adrian, LLP

(57) ABSTRACT

The present invention provides a coated conductive powder in which the aggregation of conductive particles is suppressed and which is also excellent in electrical reliability, and a conductive adhesive using the same that can provide connection with high electrical reliability even for the connection of the electrodes of miniaturized electronic parts, such as IC chips, and circuit boards. The coated conductive powder of the present invention is a coated conductive powder obtained by coating the surfaces of conductive particles with insulating inorganic fine particles, wherein the volume resistivity value of the coated conductive powder is 1 Ω·cm or less, the specific gravity of the insulating inorganic fine particles is 5.0 g/ml or less, the particle diameter ratio of the insulating inorganic fine particles to the conductive particles (the insulating inorganic fine particles/the conductive particles) is $\frac{1}{100}$ or less, and the insulating inorganic fine particles adhere to the surfaces of the conductive particles.

14 Claims, 2 Drawing Sheets

FOREIGN PATENT DOCUMENTS

| | | |
|---|---|---|
| JP | 2001-240901 A | 9/2001 |
| JP | 2003-282166 A | 10/2003 |
| JP | 2003-317827 A | 11/2003 |
| JP | 2004-179139 A | 6/2004 |
| JP | 2005-203319 A | 7/2005 |
| JP | 2006-164799 A | 6/2006 |
| WO | 03/025955 A1 | 3/2003 |
| WO | 2005/109447 A1 | 11/2005 |

COATED CONDUCTIVE POWDER AND CONDUCTIVE ADHESIVE USING THE SAME

TECHNICAL FIELD

The present invention relates to a coated conductive powder and a conductive adhesive, and particularly to an anisotropic conductive adhesive used for electrically interconnecting circuit boards, circuit parts, and the like.

BACKGROUND ART

When circuit boards, or an electronic part, such as an IC chip, and a circuit board are electrically connected, anisotropic conductive adhesives in which conductive particles are dispersed are used. These adhesives are located between opposed electrodes, and the electrodes are connected by heating and pressurization. Then, conductivity in the direction of pressurization is provided and thereby electrical connection and fixing are provided.

For example, metal particles having conductivity, and plated conductive particles obtained by forming a metal coating on the particle surfaces of a core material by electroless plating are used as the above conductive particles.

These conductive particles are required to be always monodisperse. But, the conductive particles may often cause secondary aggregation due to an external factor, such as humidity, oxidation, self-weight, or impact, depending on the storage environment, though the conductive particles are monodisperse immediately after manufacturing.

When the anisotropic conductive adhesive comprises such secondarily aggregated conductive particles, the secondarily aggregated conductive particles dispersed between the electrode spaces easily cause a short circuit.

Also, when the secondarily aggregated conductive particles are dispersed in kneading with the binder, treatment with a strong shearing force for a long time is necessary, and therefore, the deformation and breakage of the conductive particles, and the peeling off of the coating occur. Further, the curing of the epoxy proceeds due to heat generation caused by the kneading, and therefore, it is desired to perform the treatment with a short kneading time.

As methods for suppressing the aggregation of conductive particles, for example, the following Patent Document 1 proposes a method for coating the surfaces of conductive particles with polymer electrolyte thin films, such as a polyanion thin film and a polycation thin film, the following Patent Document 2 proposes a method for coating the surfaces of conductive particles with insulating hollow particles, the following Patent Document 3 proposes a method for fixing insulating inorganic fine particles, in a buried state, to particles coated with a conductive metal, the insulating inorganic fine particles having a particle diameter in the range of ⅓ to ¹/₁₀₀ of the diameter of the coated particles, and the following Patent Document 4 also proposes a method for providing an inorganic insulating layer on the surfaces of plated conductive particles. However, further, a conductive powder in which the aggregation of conductive particles is suppressed and which is also excellent in electrical reliability is desired.

Also, the following Patent Document 5 and the following Patent Document 6 propose modified electroless plated powders in which fine amorphous silica is deposited and coated on electroless plated powder surfaces.

Patent Document 1: Japanese Patent Laid-Open No. 2003-317827
Patent Document 2: Japanese Patent Laid-Open No. 2005
Patent Document 3: Japanese Patent Laid-Open No. 07-118617
Patent Document 4: Japanese Patent Laid-Open No. 2007-510268
Patent Document 5: Japanese Patent Laid-Open No. 2-15176
Patent Document 6: Japanese Patent Laid-Open No. 1-116083

DISCLOSURE OF THE INVENTION

Problems to be Solved by the Invention

However, the modified electroless plated powders obtained in the above Patent Document 5 and the above Patent Document 6 aggregate easily and also have a problem in electrical reliability.

Therefore, the present invention provides a coated conductive powder in which the aggregation of conductive particles is suppressed and which is also excellent in electrical reliability, and a conductive adhesive using the same that can provide connection with high electrical reliability even for the connection of the electrodes of miniaturized electronic parts, such as IC chips, and circuit boards.

Means for Solving the Problems

The present inventors have diligently studied over and over to solve the above problems, and, as a result, found that a coated conductive powder obtained by further coating conductive particles with insulating inorganic fine particles, wherein the volume resistivity value of the coated conductive powder is 1 Ω·cm or less, insulating inorganic fine particles in which specific gravity and the particle diameter ratio of the insulating inorganic fine particles to the above conductive particles are in a specific range are used as the above insulating inorganic fine particles, and the insulating inorganic fine particles are adhered to the particle surfaces of the conductive particles, suppresses the aggregation of the conductive particles, and further, the adhered inorganic fine particles are uniformly diffused into a conductive adhesive in kneading with the adhesive, and therefore, highly reliable connection can be provided for the connection of the electrodes of electronic parts, such as IC chips, circuit boards, and the like even if the conductive adhesive contains the conductive powder, leading to the completion of the present invention.

Specifically, a first invention provided by the present invention is a coated conductive powder obtained by coating the surfaces of conductive particles with insulating inorganic fine particles, wherein the volume resistivity value of the coated conductive powder is 1 Ω·cm or less, the specific gravity of the insulating inorganic fine particles is 5.0 g/ml or less, the particle diameter ratio of the insulating inorganic fine particles to the conductive particles (the insulating inorganic fine particles/the conductive particles) is ¹/₁₀₀ or less, and the insulating inorganic fine particles adhere to the surfaces of the conductive particles.

Also, a second invention that the present invention intends to provide is a conductive adhesive made using the coated conductive powder of the first invention.

BEST MODE FOR CARRYING OUT THE INVENTION

Figure 1:
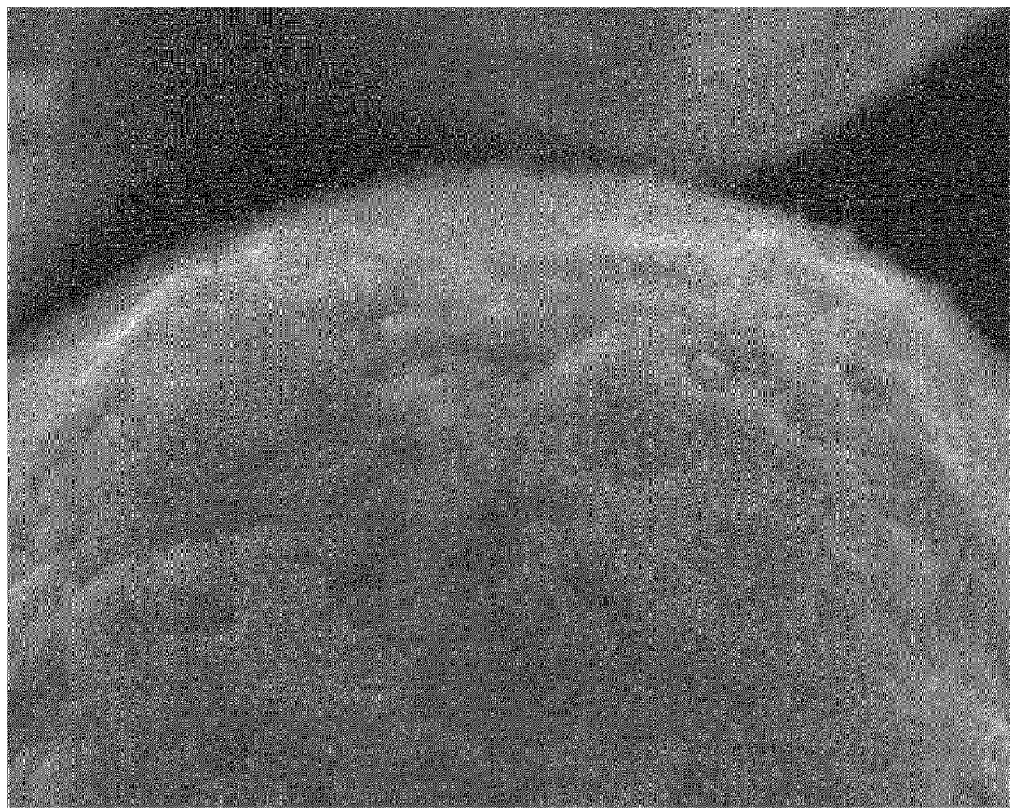
FIG. 1 is an SEM photograph showing the state of the particle surface of the coated conductive powder obtained in Example 1.

The present invention will be described below, based on preferred embodiments thereof.

The coated conductive powder of the present invention is a coated conductive powder obtained by coating the surfaces of conductive particles with insulating inorganic fine particles, and the volume resistivity value of the coated conductive powder is 1 Ω·cm or less, preferably 0.5 Ω·cm or less. One feature of the coated conductive powder of the present invention is that it has a volume resistivity value in the above range and has excellent conductivity. Therefore, the coated conductive powder of the present invention can be suitably used as the conductive filler of a conductive adhesive or the like.

In the present invention, the above volume resistivity value is a value obtained by placing 1.0 g of a sample in a vertically standing resin cylinder having an inner diameter of 10 mm, and measuring the electrical resistance between upper and lower electrodes, with a 10 kg load applied.

For the conductive particles used in the coated conductive powder of the present invention, those having conductivity by themselves, such as particles of a metal of gold, silver, copper, nickel, palladium, solder, or the like, or carbon particles, or conductive particles obtained by coating the surfaces of core material particles with a conductive metal can be used.

For the size of the conductive particles, a suitable size is selected according to the specific use of the coated conductive powder of the present invention. In a case where the coated conductive powder of the present invention is used as a conductive material for connecting electronic circuits, conduction between opposed electrodes cannot occur if the particle diameter is too small, on the other hand, a short circuit between adjacent electrodes occurs if the particle diameter is too large. Therefore, particularly preferably, the average particle diameter of the conductive particles is 0.1 to 1000 μm, preferably 0.5 to 100 μm, as a value measured using an electrical resistance method.

The shape of the conductive particles is not particularly limited. Generally, the conductive particles can be of a powder particle shape, but may be of other shapes, for example, a fiber shape, a hollow shape, a plate shape, and a needle shape, or may be of a shape having many protrusions on a particle surface or an irregular shape. In the present invention, among these, a spherical shape is particularly preferred in that the coated conductive powder has excellent filling properties when used as a conductive filler.

The preferred embodiments of the conductive particles obtained by coating the surfaces of core material particles with a conductive metal will be described in more detail. As the core material particles that can be used, either an inorganic substance or an organic substance can be used without particular limitation. Examples of the core material particles of an inorganic substance include particles of metals of gold, silver, copper, nickel, palladium, solder, and the like, alloys, glass, ceramics, silica, metal or nonmetal oxide (also including hydrate), metal silicate including aluminosilicate, metal carbide, metal nitride, metal carbonate, metal sulfate, metal phosphate, metal sulfide, metal acid salt, metal halide, carbon, and the like. On the other hand, examples of the core material particles of an organic substance include natural fibers, natural resins, thermoplastic resins, such as polyethylene, polypropylene, polyvinyl chloride, polystyrene, polybutene, polyamide, polyacrylate, polyacrylonitrile, polyacetal, ionomer, and polyester, an alkyd resin, a phenolic resin, a urea resin, a benzoguanamine resin, a melamine resin, a xylene resin, a silicone resin, an epoxy resin, a diallyl phthalate resin, or the like.

The shape of the core material particles is not particularly limited. Generally, the core material particles can be of a powder particle shape, but may be of other shapes, for example, a fiber shape, a hollow shape, a plate shape, and a needle shape, or may be of a shape having many protrusions on a particle surface or an irregular shape. In the present invention, among these, a spherical shape is particularly preferred in that the coated conductive powder has excellent filling properties when used as a conductive filler.

Particularly preferably, the average particle diameter of the above core material particles is 0.1 to 1000 μm, preferably 0.5 to 100 μm. If the particle diameter is too small, conduction between opposed electrodes cannot occur even if the particles are coated with metal. On the other hand, if the particle diameter is too large, a short circuit between adjacent electrodes occurs. The average particle diameter of the core material particles is a value measured using an electrical resistance method.

Further, the particle size distribution of the core material particles measured by the above-described method has width. Generally, the width of the particle size distribution of a powder is expressed by a coefficient of variation represented by the following calculation formula (1).

$$\text{coefficient of variation (\%)} = (\text{standard deviation}/\text{average particle diameter}) \times 100 \quad \text{calculation formula (1)}$$

A large coefficient of variation indicates that the distribution has width. On the other hand, a small coefficient of variation indicates that the particle size distribution is sharp. In this embodiment, core material particles with a coefficient of variation of 50% or less, particularly 30% or less, and especially 20% or less, are preferably used because there is an advantage that the rate of contribution effective for connection is high when the coated conductive powder obtained by the present invention is used as conductive particles in an anisotropic conductive film.

Other properties of the core material particles are not particularly limited. But, in the case of resin particles, those in which the value of K defined by the following formula (2);

$$K\ \text{value}(kgf/mm^2) = (3/\sqrt{2}) \times F \times S^{-3/2} \times R^{-1/2} \quad (2)$$

[here, F and S shown in the calculation formula (2) are respectively a load value (kgf) and compression displacement (mm), in 10% compressive deformation of the microspheres, as measured by a micro-compression tester MCTM-500 manufactured by SHIMADZU CORPORATION), and R is the radius (mm) of the microspheres] is in the range of 10 kgf/mm² to 10000 kgf/mm² at 20° C., and in which the recovery rate after the 10% compressive deformation is in the range of 1% to 100% at 20° C. are preferred in that when electrodes are pressure bonded to each other, the coated conductive powder can be brought into sufficient contact with the electrodes, without damaging the electrodes.

Dry methods, such as a vapor deposition method, a sputtering method, a mechanochemical method, and the use of hybridization treatment, wet methods, such as an electrolytic plating method and an electroless plating method, or methods combining these can be used as the method for coating the surfaces of the above core material particles with a conductive metal.

In the present invention, particles of metals of gold, silver, copper, nickel, palladium, solder, and the like, or conductive particles obtained by coating the surfaces of core material particles with one or two or more conductive metals of gold, silver, copper, nickel, palladium, solder, and the like are preferably used for the above conductive particles. Particularly, plated conductive particles obtained by forming a metal coating on the surfaces of core material particles by electroless plating are preferred in that the particle surfaces can be coated uniformly and densely. Especially, those in which the metal coating is of gold or palladium are preferred in that the conductivity can be increased. Also, in the present invention, those using resin as the core material particles are preferred in that they have lighter specific gravity than metal powders, and therefore, they do not precipitate easily, increasing dispersion stability, and that electrical connection can be maintained by the elasticity of the resin, and the like. Alloys (for example, a nickel-phosphorus alloy and a nickel-boron alloy) of the above metal coating are also included.

The preferred embodiments of the plated conductive particles will be described in more detail.

Preferably, the thickness of the metal coating in the plated conductive particles is 0.001 to 2 μm, particularly 0.005 to 1 μm. The thickness of the metal coating can be calculated, for example, from the amount of coating metal ions added and chemical analysis.

The manufacturing history of the plated conductive particles is not particularly limited. For example, when nickel plating using an electroless method is performed, a catalyzing treatment step (1), an initial thin film forming step (2), and an electroless plating step (3) are performed. In the catalyzing treatment step (1), precious metal ions are trapped by core material particles having the ability to trap precious metal ions or provided with the ability to trap precious metal ions by surface treatment, then, the precious metal ions are reduced, and the above precious metal is supported on the surfaces of the above core material particles. The initial thin film forming step (2) is the step of dispersing and mixing the core material particles, on which the precious metal is supported, in an initial thin film forming liquid comprising nickel ions, a reducing agent, and a complexing agent, reducing the nickel ions, and forming an initial thin film of nickel on the surfaces of the core material particles. The electroless plating step (3) is the step of manufacturing a plated powder having a nickel coating on the surfaces of the core material particles by electroless plating. These steps and other metal plating methods are all publicly known (for example, see Japanese Patent Laid-Open No. 60-59070, Japanese Patent Laid-Open No. 61-64882, Japanese Patent Laid-Open No. 62-30885, Japanese Patent Laid-Open No. 01-242782, Japanese Patent Laid-Open No. 02-15176, Japanese Patent Laid-Open No. 08-176836, Japanese Patent Laid-Open No. 08-311655, Japanese Patent Laid-Open No. 10-101962, Japanese Patent Laid-Open Nos. 2000-243132, 2004-131800, 2004-131801, and 2004-197160, and the like).

In performing the above catalyzing treatment step (1), preferably, the surfaces of the core material particles have the ability to trap precious metal ions, or the core material particles are surface-modified to have the ability to trap precious metal ions. The precious metal ions are preferably palladium or silver ions. Having the ability to trap precious metal ions refers to being able to trap precious metal ions as a chelate or a salt. For example, when amino groups, imino groups, amide groups, imide groups, cyano groups, hydroxyl groups, nitrile groups, carboxyl groups, or the like are present on the surfaces of the core material particles, the surfaces of the core material particles have the ability to trap precious metal ions. When the core material particles are surface-modified to have the ability to trap precious metal ions, for example, a method described in Japanese Patent Laid-Open No. 61-64882 or Japanese Patent Laid-Open No. 2007-262495, or the like can be used.

The conductive particles used may be conductive particles obtained by further forming an insulating layer of resin on the conductive particle surfaces. One example of the conductive particles obtained by forming an insulating layer of resin on the above particle surfaces is, for example, conductive particles described in Japanese Patent Laid-Open No. 5-217617, Japanese Patent Laid-Open No. 5-70750, or the like.

On the other hand, one important requirement in the present invention is to use insulating inorganic fine particles having a specific gravity of 5.0 g/ml or less. The specific gravity of the insulating inorganic fine particles in the above range suppresses the coming off of the adhered insulating inorganic fine particles due to an external factor, such as slight impact. Also, the adhered insulating inorganic fine particles can be uniformly diffused into a conductive adhesive in kneading with the adhesive. On the other hand, when insulating inorganic fine particles having a specific gravity of more than 5.0 g/ml are used, the adhered insulating inorganic fine particles come off due to an external factor, such as slight impact, and therefore, the particles aggregate easily. On the other hand, it is difficult to uniformly diffuse the insulating inorganic fine particles into the adhesive. Also, for insulating inorganic fine particles having a specific gravity less than 1.0 g/ml, the insulating inorganic fine particles can be adhered to the surfaces of the conductive particles, but the insulating inorganic fine particles are not easily mixed in subsequent kneading with resin and tend to be operationally difficult. Therefore, the specific gravity of the insulating inorganic fine particles is preferably 1.0 to 5.0 g/ml, particularly preferably 1.2 to 4.8 g/ml.

As the insulating inorganic fine particles having the above specific gravity, one or an appropriate combination of two or more of, for example, oxides, such as titanium oxide ($TiO_2$), aluminum oxide ($Al_2O_3$), silica ($SiO_2$), calcium oxide, magnesium oxide, and ferrites, hydroxides, such as calcium hydroxide, magnesium hydroxide, aluminum hydroxide, and basic magnesium carbonate, carbonates, such as calcium carbonate, magnesium carbonate, zinc carbonate, barium carbonate, dawsonite, and hydrotalcite, sulfates, such as calcium sulfate, barium sulfate, and gypsum fiber, silicates, such as calcium silicate, talc, clay, mica, montmorillonite, bentonite, activated clay, sepiolite, imogolite, and glass fiber, nitrides, such as aluminum nitride, boron nitride, and silicon nitride, and the like can be used. Among these, titanium oxide ($TiO_2$), aluminum oxide ($Al_2O_3$), and silica ($SiO_2$) are preferred in terms of specific gravity, particle diameter, small effect on an epoxy resin and a curing agent, and the like. Especially, fumed silica is particularly preferred in that a dry powder having a small particle diameter is easily obtained, that no coarse particles are present, and that the dispersibility in an adhesive resin is good.

Fumed silica is generally manufactured by combusting silicon tetrachloride in an oxyhydrogen flame, and a fumed silica having a specific surface area of about 40 to 500 $m^2$/g is commercially available. AEROSIL manufactured by NIPPON AEROSIL CO., LTD., AEROSIL manufactured by Toshin Chemicals Co., Ltd., AEROSIL manufactured by Degussa, CAB-O-SIL manufactured by Cabot, and the like can be used as commercial products. In the present invention, hydrophilic or hydrophobic fumed silica can be used. Particularly, the use of hydrophobic fumed silica is preferred in that when it adheres to particles, the entire particles are made hydrophobic, and the moisture resistance is improved, and the like. The insulating inorganic fine particles are not limited to fumed silica, and those having hydrophobicity are preferably used for the above reasons.

For the insulating inorganic fine particles used, those in which the particle diameter ratio of the insulating inorganic fine particles to the above conductive particles (the insulating inorganic fine particles/the conductive particles) is 1/100 or less, preferably 1/200 or less, are selected and appropriately used. In the present invention, the particle diameter ratio of the insulating inorganic fine particles to the above conductive particles (the insulating inorganic fine particles/the conductive particles) in the above range makes it possible to uniformly adhere the insulating inorganic fine particles to the surfaces of the conductive particles. On the other hand, if this particle diameter ratio is more than 1/100, it is difficult to uniformly adhere the insulating inorganic fine particles to the surfaces of the conductive particles, and therefore, such a particle diameter ratio is not preferred. The lower limit value is not particularly limited as long as it is in the range of more than 0.

In the present invention, insulating inorganic fine particles with the particle diameter ratio of the insulating inorganic fine particles to the conductive particles (the insulating inorganic fine particles/the conductive particles) in the above range are used. But, for the insulating inorganic fine particles themselves, the use of insulating inorganic fine particles in which the average particle diameter obtained by calculation using a BET method, or by a dynamic light scattering method or the like is 1 nm to 10 µm, preferably 2 nm to 1 µm, is preferred in that they can be easily adhered to the conductive particles and dispersibility can be provided.

For the amount of the coating insulating inorganic fine particles with respect to 1 g of the conductive particles, preferably, the value of a constant n shown in the following formula (3) is $4 \times 10^4$ to $3 \times 10^{10}$, preferably $1 \times 10^5$ to $3 \times 10^9$, in terms of dispersion stability. If the constant n is less than $4 \times 10^4$, the amount of the insulating inorganic fine particles coating the conductive particles decreases, and the effect of improving dispersibility is not easily obtained. On the other hand, if the constant n is more than $3 \times 10^9$, excess insulating inorganic fine particles increase, causing an increase in viscosity, and a decrease in adhesion, mechanical strength, and the like, in kneading with a binder.

The amount of the insulating inorganic fine particles added (g) with respect to 1 g of the conductive particles $\geq n \times (r_2^3 \times d_2)/(r_1^3 \times d_1)$ (3)

provided that $r_1 \geq 100 \times r_2$ n: constant $r_1$: the radius of the conductive particles $d_1$: the specific gravity of the conductive particles $r_2$: the radius of the insulating inorganic fine particles $d_2$: the specific gravity of the insulating inorganic fine particles The method for coating the conductive particles with the insulating inorganic fine particles may be either a dry method or a wet method. But, the dry method is easy in manufacturing and is industrially advantageous. Also, the dry method is particularly preferred in that in the obtained coated conductive powder, there is no coming off of the adhered insulating inorganic fine particles due to an external factor, such as slight impact, and that for the adhered insulating inorganic fine particles, those easily uniformly diffused into an anisotropic conductive adhesive in the kneading treatment of the adhesive are obtained.

The dry method is performed by introducing predetermined conductive particles and insulating inorganic fine particles into a mixing apparatus. For example, a high speed mixer, a super mixer, Turbo Sphere Mixer, Eirich Mixer, Henschel Mixer, Nauta Mixer, a ribbon blender, a jet mill, Cosmomizer, a paint shaker, a bead mill, a ball mill, and the like can be used as the mixing apparatus. In the present invention, among these, the use of a bead mill or a ball mill (also referred to as a pot mill) is particularly preferred in that particularly when electroless plated particles are used as the conductive particles, the peeling of the metal coating, and the like are suppressed, and the insulating inorganic fine particles can be uniformly adhered to the particle surfaces of the conductive particles, and that for the adhered insulating inorganic fine particles, those easily uniformly diffused into an anisotropic conductive adhesive in the kneading treatment of the adhesive are obtained.

For example, when a ball mill is used as the above mixing apparatus, the use of a particulate medium, such as beads, having a particle diameter of 10 mm or less, preferably 0.1 to 5 mm, is preferred in that the insulating inorganic fine particles can be uniformly adhered, and that the operability is also good. Also, for the material of the particulate medium, ceramic beads of zirconia, alumina, glass, and the like, resin balls of Teflon (registered trademark), nylon, and the like, steel balls coated with resin, such as Teflon (registered trademark) and nylon, and the like are particularly preferably used because they have suitable hardness and can prevent metal contamination. Also, when the particulate medium is housed in the container, with an apparent volume of 10 to 60%, preferably 20 to 50%, the insulating inorganic fine particles can be uniformly adhered. The number of revolutions N depends on the inner diameter of the container used. Preferably, the value of a shown in the following formula (t) is 0.4 to 085, more preferably 0.45 to 0.80, because the insulating inorganic fine particles can be efficiently adhered to the conductive fine particles in the container.

$$N = a \times 42.3/\sqrt{D}$$ (t)

N: the number of revolutions [rpm]

D: the inner diameter of the ball mill container [m]

a: constant

On the other hand, in the case of the wet method, for example, a method is preferred in which a slurry comprising predetermined conductive particles and insulating inorganic fine particles is introduced into a spray dryer and is dried together with the solvent.

The coated conductive powder of the present invention is obtained in this manner. In the coated conductive powder of the present invention, the particle surfaces of the powder can be further coated with a coupling agent, such as a powdery, thermally latent curing agent, a silane coupling agent, aluminum coupling, a titanate coupling agent, or a zirconate coupling agent, or an insulating resin, as required, within the range that the effect of the present invention is not impaired.

The coated conductive powder according to the present invention is useful as the conductive filler of a conductive adhesive or a conductive film.

<Conductive Adhesive>

The conductive adhesive of the present invention is preferably used as an anisotropic conductive adhesive that is located between two boards, on which a conductive substrate is formed, and heated and pressurized to adhere the above conductive substrates for conduction.

The preferred embodiments of the anisotropic conductive adhesive will be described below in more detail.

The anisotropic conductive adhesive of the present invention comprises the above coated conductive powder and an adhesive resin.

As the adhesive resin, those used as adhesive resins can be used without particular limitation, but those exhibiting adhesion performance by heating are preferred, either thermoplastic resins or thermosetting. For example, there are a thermoplastic type, a thermosetting type, an ultraviolet curing type, and the like. Also, the so-called semi-thermosetting type exhibiting properties between those of the thermoplastic type and the thermosetting type, a complex type of the thermosetting type and the ultraviolet curing type, and the like are used. These adhesive resins can be appropriately selected according to the surface properties of circuit boards or the like, adherends, and the use form. But, adhesive resins comprising thermosetting resins are preferred because the material strength after adhesion is excellent.

Specific examples of the adhesive resin include those adjusted using as the main agent one obtained by one or a combination of two or more selected from an ethylene-vinyl acetate copolymer, a carboxyl-modified ethylene-vinyl acetate copolymer, an ethylene-isobutyl acrylate copolymer, polyamide, polyimide, polyester, polyvinyl ether, polyvinyl butyral, polyurethane, an SBS block copolymer, a carboxyl-modified SBS copolymer, an SIS copolymer, an SEBS copolymer, a maleic acid-modified SEBS copolymer, a polybutadiene rubber, a chloroprene rubber, a carboxyl-modified chloroprene rubber, a styrene-butadiene rubber, an isobutylene-isoprene copolymer, an acrylonitrile-butadiene rubber (hereinafter represented as an NBR), a carboxyl-modified NBR, an amine-modified NBR, an epoxy resin, an epoxy ester resin, an acrylic resin, a phenolic resin, a silicone resin, or the like. Among them, preferably, a styrene-butadiene rubber, SEBS, and the like have excellent rework properties as the thermoplastic resins. An epoxy resin is preferred as the thermosetting resin. Among these, an epoxy resin is most preferred because of the advantages of having high adhesion, excellent heat resistance and electrical insulation, and low melt viscosity, and being capable of providing connection at low pressure.

For the epoxy resin that can be used, generally used epoxy resins can be used as long as they are polyvalent epoxy resins having two or more epoxy groups in one molecule. Specific examples of the epoxy resins include glycidyl epoxy resins obtained by reacting novolak resins, such as phenol novolak and cresol novolak, polyhydric phenols, such as bisphenol A, bisphenol F, bisphenol AD, resorcin, and bishydroxydiphenyl ether, polyhydric alcohols such as ethylene glycol, neopentyl glycol, glycerin, trimethylolpropane, and polypropylene glycol, polyamino compounds, such as ethylenediamine, triethylenetetramine, and aniline, polyvalent carboxy compounds, such as adipic acid, phthalic acid, and isophthalic acid, or the like with epichlorohydrin or 2-methylepichlorohydrin. Specific examples of the epoxy resins also include aliphatic and alicyclic epoxy resins, such as dicyclopentadiene epoxide and butadiene dimer diepoxide, and the like. These can be used alone, or two or more of these can be mixed and used.

For these adhesive resins, the use of high purity products with a small amount of impurity ions (such as Na and Cl), hydrolyzable chlorine, and the like is preferred to prevent ion migration.

The amount of the coated conductive powder of the present invention used is generally 0.1 to 30 parts by weight, preferably 0.5 to 25 parts by weight, and more preferably 1 to 20 parts by weight, with respect to 100 parts by weight of the adhesive resin component. The amount of the coated conductive powder used being in the above range can suppress high connection resistance and melt viscosity, improve connection reliability, and ensure sufficient connection anisotropy.

In the anisotropic conductive adhesive according to the present invention, in addition, additives publicly known in the art can be used. Also, the amount of the additives added should be in the range of the amount publicly known in the art. Examples of other additives can include a tackifier, a reactive aid, metal oxide, a photoinitiator, a sensitizer, a curing agent, a vulcanizing agent, a degradation preventing agent, a heat-resistant additive, a thermal conduction improving agent, a softener, a colorant, various coupling agents, a metal deactivator, or the like.

Examples of the tackifier include rosin, a rosin derivative, a terpene resin, a terpene phenolic resin, a petroleum resin, a coumarone-indene resin, a styrene resin, an isoprene resin, an alkylphenol resin, a xylene resin, and the like. Examples of the reactive aid, that is, a crosslinking agent, include polyol, isocyanates, a melamine resin, a urea resin, utropins, amines, acid anhydride, peroxide, and the like.

As an epoxy resin curing agent, those having two or more active hydrogens in one molecule can be used without particular limitation. Specific examples of the epoxy resin curing agent include polyamino compounds, such as diethylenetriamine, triethylenetetramine, metaphenylenediamine, dicyandiamide, and polyamidoamine, organic acid anhydrides, such as phthalic anhydride, methyl nadic anhydride, hexahydrophthalic anhydride, and pyromellitic anhydride, novolak resins, such as phenol novolak and cresol novolak, and the like. These can be used alone, or two or more of these can be mixed and used. Also, a latent curing agent may be used according to the use and need. Examples of the latent curing agent that can be used include an imidazole type, a hydrazide type, a boron trifluoride-amine complex, sulfonium salt, amine imide, polyamine salt, dicyandiamide, and the like, and modified compounds thereof. These can be used alone or as a mixture of two or more.

The anisotropic conductive adhesive of the present invention is generally manufactured by using a manufacturing apparatus widely used among those skilled in the art, compounding the coated conductive powder of the present invention, an adhesive resin component, a curing agent, and further various additives as desired, and mixing the materials, in an organic solvent as required, in a case where the adhesive resin component is a thermosetting resin, and melting and kneading the materials at a temperature equal to or higher than the softening point of the adhesive resin component, specifically about 50 to 130° C., preferably about 60 to 110° C., in a case where the adhesive resin component is a thermoplastic resin.

The anisotropic conductive adhesive may be applied or may be formed into a film shape for application.

The anisotropic conductive adhesive according to the present invention can provide highly reliable connection also for the connection of the electrodes of miniaturized electronic parts, such as IC chips, and circuit boards.

Particularly, the conductive adhesive of the present invention can be suitably used for the connection of the electrodes of an IC tag.

EXAMPLES

The present invention will be described below by Examples, but the present invention is not limited to these Examples.

<Insulating Inorganic Fine Particle Powders>

Commercially available insulating inorganic fine particles shown in Table 1 were used as samples.

TABLE 1

| | Type | Average particle diameter (nm) | Specific gravity (g/ml) |
|---|---|---|---|
| Sample A | hydrophilic fumed silica | 7 | 2.2 |
| Sample B | hydrophobic fumed silica | 12 | 2.2 |
| Sample C | hydrophobic $TiO_2$ | 21 | 4.2 |
| Sample D | hydrophilic fumed silica | 13 | 3.8 |
| Sample E | $ZrO_2$ | 10 | 5.5 |
| Sample F | hydrophilic $SiO_2$ | 500 | 2.2 |

Notes)
the sample A; hydrophilic fumed silica; manufactured by NIPPON AEROSIL CO., LTD., trade name (AEROSIL 300),
the sample B; hydrophobic fumed silica; manufactured by NIPPON AEROSIL CO., LTD., trade name (AEROSIL RY200),
the sample C; $TiO_2$; manufactured by NIPPON AEROSIL CO., LTD., trade name (AEROXIDE $TiO_2$T805),
the sample D; $Al_2O_3$; manufactured by NIPPON AEROSIL CO., LTD., trade name (AEROXIDE ALuC)

{Conductive Particles}
<Preparation of Gold-Plated Conductive Particles>

Conductive particles coated with gold plating (samples 2 to 4) shown in Table 2 were prepared as follows.

100 g of metal particles shown in Table 2 were stirred in an aqueous solution of 50 ml/l hydrochloric acid for 5 minutes. The mixture was filtered, and the nickel powder was repulp-washed with water once, and added, with stirring, to 1 liter of a mixed aqueous solution at a liquid temperature of 60° C. prepared with a composition of EDTA-4Na (10 g/l) and citric acid-2Na (10 g/l) at pH 6. Then, a mixed aqueous solution (liquid A) of potassium gold cyanide (10 g/l, 6.8 g/l Au), EDTA-4Na (10 g/l), and citric acid-2Na (10 g/l), and a mixed aqueous solution (liquid B) of potassium borohydride (30 g/l) and sodium hydroxide (60 g/l) were added individually and simultaneously through a feed pump for 20 minutes. At this time, the amount of the liquid A added was 120 ml, and the amount of the liquid B was 120 ml.

<Preparation of Nickel-Gold-Plated Conductive Particles>

Conductive particles coated with nickel-gold plating (samples 5 to 9) shown in Table 2 were prepared as follows.

(1) Catalyzing Treatment Step 200 milliliters of an aqueous solution of stannous chloride was introduced into 200 milliliters of a slurry comprising 7.5 parts by weight of a core material shown in Table 2. The concentration of this aqueous solution was 5×10−3 moles/liter. They were stirred at room temperature for 5 minutes to perform sensitization treatment in which tin ions were adsorbed on the surfaces of the core material particles. Then, the aqueous solution was filtered, and the core material particles were repulp-washed with water once. Then, 400 milliliters of a slurry of the core material particles was made and maintained at 60° C. While the slurry was stirred using ultrasonic waves together, 2 milliliters of an aqueous solution of 0.11 mol g/liter palladium chloride was added. The stirring state as it is was maintained for 5 minutes to perform activation treatment in which palladium ions are trapped on the surfaces of the core material particles. Then, the aqueous solution was filtered. The core material particles were repulp-washed with hot water once, and 200 milliliters of a slurry of the core material particles was made. This slurry was stirred using ultrasonic waves together, and 20 milliliters of a mixed aqueous solution of 0.017 moles/liter dimethylamine borane and 0.16 moles/liter boric acid was added to the slurry. The slurry was stirred, using ultrasonic waves together, at room temperature for 2 minutes to perform palladium ion reduction treatment.

(2) Initial Thin Film Forming Step 200 milliliters of the slurry obtained in the step (1) was added to an initial thin film forming liquid comprising 0.087 moles/liter sodium tartrate, 0.005 moles/liter nickel sulfate, and 0.012 moles/liter sodium hypophosphite, with stirring, to provide an aqueous suspension. The temperature of the initial thin film forming liquid was increased to 75° C., and the amount of the liquid was 1.0 liter. Immediately after the introduction of the slurry, the production of hydrogen was noted, and the start of initial thin film formation was confirmed.

(3) Electroless Plating Step

Two liquids, a nickel ion containing liquid comprising 0.86 moles/liter nickel sulfate and 0.17 moles/liter sodium tartrate and a reducing agent containing liquid comprising 2.57 moles/liter sodium hypophosphite and 2.6 moles/liter sodium hydroxide, were added to the aqueous suspension obtained in the initial thin film forming step at an addition rate of 8 milliliters/minute. The amount of the liquids added was adjusted so that the deposited film thickness was 0.2 microns. Immediately after the addition of the two liquids, the production of hydrogen was noted, and the start of plating reaction was confirmed. After the addition of the two liquids was completed, stirring was continued, while the temperature of 75° C. was maintained, until the bubbling of hydrogen stopped. Then, the aqueous suspension was filtered, and the filtered material was repulp-washed three times and then dried by a vacuum dryer at 110° C. Thus, an electroless nickel-plated powder having a nickel-phosphorus alloy plating coating was obtained.

Then, 10 g of the above electroless nickel-plated particles were added, with stirring, to 750 mL of an electroless plating liquid at a liquid temperature of 60° C. with a composition of EDTA-4Na (10 g/L), citric acid-2Na (10 g/L), and potassium gold cyanide (3.2 g/L, 2.2 g/L Au), adjusted to pH 6 with an aqueous solution of sodium hydroxide, to perform plating treatment for 10 minutes. Then, 120 mL of a mixed aqueous solution of potassium gold cyanide (20 g/L, 13.7 g/L Au), EDTA-4Na (10 g/L), and citric acid-2Na (10 g/L), and 120 mL of a mixed aqueous solution of potassium borohydride (30 g/L) and sodium hydroxide (60 g/L) were separately added through a feed pump for 20 minutes. Then, the liquid was filtered, and the filtered material was repulp-washed three times and then dried at a temperature of 100° C. by the vacuum dryer to perform gold plating coating treatment on the nickel plating coating of the spherical core material particles.

[Thickness of Plating Coating]

The plated powder was immersed in nitric acid to dissolve the plating coating. The coating component was quantified by ICP or chemical analysis, and the thickness was calculated by the following formula.

$$A = [(r+t)^3 - r^3] d_1 / r d_2$$

$$A = W/100 - W$$

In the formula, r represents the radius (μm) of the core material particles, t represents the thickness (μm) of the plating coating, $d_1$ represents the specific gravity of the plating coating, $d_2$ represents the specific gravity of the core material particles, and W represents metal content (% by weight).

TABLE 2

|  | Properties of core material | | | Plating coating thickness | |
| --- | --- | --- | --- | --- | --- |
|  | Type of core material | Average particle diameter μm | Specific gravity g/ml | Coefficient of variation (%) | Ni plating coating nm | Au plating coating nm |
| Sample 1 | Spherical nickel | 6 | 9 | 14 | — | — |
| Sample 2 | Spherical nickel | 2.5 | 10 | 18 | — | 46 |
| Sample 3 | Spherical nickel | 6 | 9 | 14 | — | 24 |
| Sample 4 | Spherical copper | 5 | 9 | 10 | — | 29 |
| Sample 5 | Spherical silica | 5 | 3.5 | 3 | 50 | 24 |
| Sample 6 | Spherical benzoguanamine resin | 3 | 3.5 | 2.5 | 35 | 35 |
| Sample 7 | Spherical benzoguanamine resin | 4.6 | 3.5 | 2.5 | 56 | 24 |
| Sample 8 | Spherical acrylic resin | 4 | 2.5 | 3.5 | 83 | 23 |
| Sample 9 | Spherical styrene resin | 5 | 2.5 | 3.5 | 58 | 35 |

Examples 1 to 14 and Comparative Examples 1 to 5

A predetermined amount of insulating inorganic fine particles and conductive particles shown in Table 3, and further zirconia balls (particle diameter; 1 mm) having an apparent volume of 0.3 L were placed and sealed in a cylindrical container (pot mill) having an internal capacity of 0.7 L and an inner diameter of 0.09 m, and the cylindrical container was rotated at 100 rpm. The number of revolutions at this time was obtained by the following formula (t) in which a is 0.71. The treatment was performed for 60 minutes so that the insulating inorganic fine particles uniformly adhered to the conductive particles, and then, the zirconia balls and the obtained coated conductive powder were separated.

$$N = a \times 42.3 / \sqrt{D} \quad (t)$$

Figure 2:
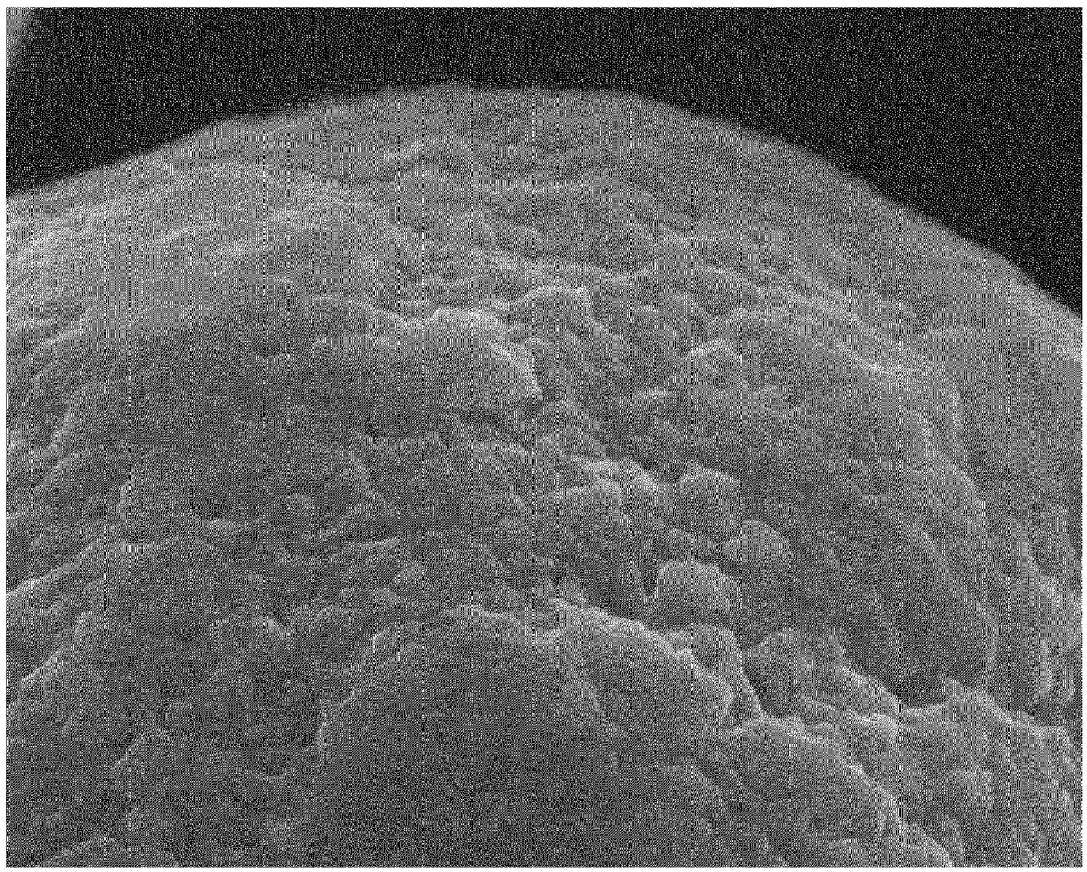
FIG. 2 is an SEM photograph showing the state of the particle surface of the uncoated nickel particle used in Comparative Example 1.

N: the number of revolutions [rpm]
D: the inner diameter of the ball mill container [m]
a: constant The particle surface of each of the obtained coated conductive powders was observed in a scanning electron microscope photograph. It was confirmed that the insulating inorganic fine particles uniformly adhered to the entire surface of the conductive particle. The SEM photograph of the coated conductive powder in Example 1 is shown in FIG. 1, and the SEM photograph of the conductive particle in Comparative Example 1 is shown in FIG. 2.

The value of n was obtained by the following calculation formula (4).

$$\text{the amount of the insulating inorganic fine particles added (g) with respect to 1 g of the conductive particles} = n \times (r_2^3 \times d_2)/(r_1^3 \times d_1) \quad (4)$$

n: constant
$r_1$: the radius of the conductive particles  $d_1$: the specific gravity of the conductive particles
$r_2$: the radius of the insulating inorganic fine particles  $d_2$: the specific gravity of the insulating inorganic fine particles

TABLE 3

|  | (A) conductive particles | | (B) insulating inorganic fine particles | | Value of n (× 10$^6$) | Particle diameter ratio (B/A) |
| --- | --- | --- | --- | --- | --- | --- |
|  | Type | Combined amount (parts by weight) | Type | Combined amount (parts by weight) | | |
| Example 1 | Sample 1 | 50 | Sample B | 0.5 | 5.1 | 0.0020 |
| Example 2 | Sample 2 | 20 | Sample B | 0.5 | 1 | 0.0048 |
| Example 3 | Sample 3 | 50 | Sample B | 0.5 | 5.1 | 0.0020 |
| Example 4 | Sample 4 | 50 | Sample B | 0.5 | 3 | 0.0024 |
| Example 5 | Sample 5 | 20 | Sample B | 0.5 | 2.9 | 0.0024 |
| Example 6 | Sample 6 | 20 | Sample B | 0.5 | 6.2 | 0.0040 |
| Example 7 | Sample 7 | 20 | Sample B | 0.5 | 1.6 | 0.0026 |
| Example 8 | Sample 7 | 20 | Sample B | 4 | 13 | 0.0026 |
| Example 9 | Sample 8 | 20 | Sample B | 0.5 | 1.1 | 0.0030 |
| Example 10 | Sample 9 | 20 | Sample B | 0.5 | 2.1 | 0.0024 |

TABLE 3-continued

| | (A) conductive particles | | (B) insulating inorganic fine particles | | Value of n (× 10$^6$) | Particle diameter ratio (B/A) |
|---|---|---|---|---|---|---|
| | Type | Combined amount (parts by weight) | Type | Combined amount (parts by weight) | | |
| Example 11 | Sample 2 | 50 | Sample A | 0.5 | 2.1 | 0.0028 |
| Example 12 | Sample 7 | 20 | Sample A | 0.5 | 8.1 | 0.0015 |
| Example 13 | Sample 7 | 20 | Sample C | 0.5 | 4.2 | 0.0046 |
| Example 14 | Sample 7 | 20 | Sample D | 0.5 | 4.2 | 0.0028 |
| Comparative Example 1 | Sample 1 | 100 | — | — | — | — |
| Comparative Example 2 | Sample 2 | 100 | — | — | — | — |
| Comparative Example 3 | Sample 7 | 100 | — | — | — | — |
| Comparative Example 4 | Sample 7 | 100 | Sample E | 0.5 | 0.64 | 0.0022 |
| Comparative Example 5 | Sample 7 | 100 | Sample F | 10 | 0.00044 | 0.1087 |

Comparative Example 6

A method described in Japanese Patent Laid-Open No. 2-15176 was followed. 100 parts of the conductive powder of the sample 7 was dispersed in 1000 parts of water, and a small amount of an aqueous solution of No. 3 sodium sodium silicate was added. The temperature of the slurry was increased to 85° C., and then, the slurry was adjusted to pH 9.5.

A liquid A: a liquid in which 60.9 parts of No. 3 sodium silicate was diluted with 267 parts of water, and a liquid B: a liquid in which 9.6 parts of a 96% $H_2SO_4$ liquid was diluted with 361 parts of water were simultaneously added at a rate of 2.7 parts/minute to the slurry being stirred. Also while the liquid A and the liquid B were added, the pH of the slurry was controlled to 9.5±0.3.

Then, after the completion of the simultaneous addition, the pH of the slurry was neutralized to 6.7. Then, filtration and washing were repeated, until sulfate radicals disappeared, for recovery, followed by drying to obtain a silica-coated conductive powder.

<Reliability Test>

(1) Accelerated Test

The coated conductive powders in Examples 1 to 14 and the conductive particles in Comparative Examples 1 to 6 were left under conditions of 60° C. and a humidity of 95% for 1000 hours.

(Measurement of Volume Resistivity Value)

1.0 g of the sample treated as described above or the sample before the treatment was placed in a vertically standing resin cylinder having an inner diameter of 10 mm, and the electrical resistance between upper and lower electrodes was measured, with a 10 kg load applied, to obtain the volume resistivity value. The results are shown in Table 4.

TABLE 4

| | Volume resistivity value (Ω · cm) | |
|---|---|---|
| | Before treatment | After treatment |
| Example 1 | 2.0 × 10$^{-2}$ | 8.5 × 10$^{-2}$ |
| Example 2 | 1.0 × 10$^{-3}$ | 1.0 × 10$^{-3}$ |
| Example 3 | 1.0 × 10$^{-3}$ | 1.0 × 10$^{-3}$ |
| Example 4 | 1.0 × 10$^{-3}$ | 1.0 × 10$^{-3}$ |
| Example 5 | 1.0 × 10$^{-3}$ | 1.0 × 10$^{-3}$ |
| Example 6 | 1.0 × 10$^{-3}$ | 1.0 × 10$^{-3}$ |
| Example 7 | 1.0 × 10$^{-3}$ | 1.0 × 10$^{-3}$ |
| Example 8 | 1.0 × 10$^{-3}$ | 1.0 × 10$^{-3}$ |
| Example 9 | 1.0 × 10$^{-3}$ | 1.0 × 10$^{-3}$ |
| Example 10 | 1.0 × 10$^{-3}$ | 1.0 × 10$^{-3}$ |
| Example 11 | 1.0 × 10$^{-3}$ | 1.5 × 10$^{-3}$ |
| Example 12 | 1.0 × 10$^{-3}$ | 2.0 × 10$^{-3}$ |
| Example 13 | 1.0 × 10$^{-3}$ | 1.0 × 10$^{-3}$ |
| Example 14 | 1.0 × 10$^{-3}$ | 1.0 × 10$^{-3}$ |
| Comparative Example 1 | 2.0 × 10$^{-2}$ | >100 |
| Comparative Example 2 | 1.0 × 10$^{-3}$ | 2.5 × 10$^{-2}$ |
| Comparative Example 3 | 1.0 × 10$^{-3}$ | 2.0 × 10$^{-2}$ |
| Comparative Example 4 | 1.0 × 10$^{-3}$ | 2.0 × 10$^{-2}$ |
| Comparative Example 5 | 1.0 × 10$^{-3}$ | >100 |
| Comparative Example 6 | >100 | >100 |

From the results in Table 4, the coated conductive powders of the present invention had good electrical conductivity, and also maintained good conduction performance, without increasing the resistance value, even if they were treated at 60° C. and 95% RH for 1000 hours.

(2) Dispersibility Test (Preparation of Anisotropic Conductive Adhesives)

Using the coated conductive powders in Examples 1 to 14 and the conductive particles in Comparative Examples 1 to 6 before and after the above treatment at 60° C. and 95% RH for 1000 hours, about 3 to 15 weight of the coated conductive powder or the conductive particles such that three hundred millions of the coated conductive powder particles or the conductive particles/cm³ were present in a resin, 100 parts by weight of an epoxy main agent, JER828 (manufactured by Japan Epoxy Resins Co., Ltd.), 30 parts by weight of a curing agent, AJICURE PN23J (manufactured by Ajinomoto Fine-Techno Co., Inc.), and 2 parts by weight of a viscosity adjusting agent were kneaded by a planetary stirrer for 1 minute to obtain a paste.

(Dispersibility Evaluation)

The paste was applied with a film thickness of 100 μm by an applicator. A 10 cm² area of the paste was observed by a scanning electron microscope at 200×, and the number of aggregates having a major axis of 10 μm or more was measured. The results are shown in Table 5. Symbols in the Table indicate the following.

"◉" indicates that there are no aggregate particles. "○" indicates that one to two aggregate particles are present. "x" indicates that three or more aggregate particles are present.

TABLE 5

| | Presence or absence of 10 μm or more aggregate particles | |
|---|---|---|
| | Before treatment | After treatment |
| Example 1 | ◉ | ◉ |
| Example 2 | ◉ | ◉ |
| Example 3 | ◉ | ◉ |
| Example 4 | ◉ | ◉ |
| Example 5 | ◉ | ◉ |
| Example 6 | ◉ | ◉ |
| Example 7 | ◉ | ◉ |
| Example 8 | ◉ | ◉ |
| Example 9 | ◉ | ◉ |
| Example 10 | ◉ | ◉ |
| Example 11 | ◉ | ◉ |
| Example 12 | ◉ | ◉ |
| Example 13 | ◉ | ◉ |
| Example 14 | ◉ | ◉ |
| Comparative Example 1 | ◉ | X |
| Comparative Example 2 | ◉ | X |
| Comparative Example 3 | ◉ | X |
| Comparative Example 4 | ◉ | X |
| Comparative Example 5 | ◉ | X |
| Comparative Example 6 | X | X |

From the results in Table 5, the coated conductive powders of the present invention were in a good dispersed state even after the treatment at 60° C. and 95% RH for 1000 hours.

(3) Mounting Evaluation
(Fabrication of IC Tags)

5 parts by weight of the coated conductive powders in Examples 1 to 14 and the conductive particles in Comparative Examples 1 to 6, 100 parts by weight of JER828 (manufactured by Japan Epoxy Resins Co., Ltd.), 30 parts by weight of a curing agent, AJICURE PN23J (manufactured by Ajinomoto Fine-Techno Co., Inc.), and 2 parts of a viscosity preparing agent were kneaded by a planetary stirrer to obtain pastes as adhesive samples.

Then, the above adhesive sample was applied, 2.5 mm long×2.5 mm wide×0.05 mm thick, on the antenna board of an IC tag in which aluminum wiring is formed on a PET film. An IC having gold bumps was placed thereon and was thermocompression bonded at 160° C. at a pressure of 2.0 N for 15 seconds to fabricate an IC tag inlay. The communication test of the obtained inlays was performed.

(Reliability Test)

The inlets obtained in the mounting test were arranged in an enclosed container, and a pressure cracker test (temperature: 121° C., relative humidity: 100%, 2 atmospheric pressure) was performed. After the treatment for 10 hours, a communication test was performed, and conduction was checked. The results are shown in Table 6.

For evaluation, a case where all 10 samples can communicate was evaluated as "○," and a case where one or more of 10 samples can not communicate was evaluated as "x."

TABLE 6

| | Communication test | |
|---|---|---|
| | Before treatment | After treatment |
| Example 1 | ○ | ○ |
| Example 2 | ○ | ○ |
| Example 3 | ○ | ○ |
| Example 4 | ○ | ○ |
| Example 5 | ○ | ○ |
| Example 6 | ○ | ○ |
| Example 7 | ○ | ○ |
| Example 8 | ○ | ○ |
| Example 9 | ○ | ○ |
| Example 10 | ○ | ○ |
| Example 11 | ○ | ○ |
| Example 12 | ○ | ○ |
| Example 13 | ○ | ○ |
| Example 14 | ○ | ○ |
| Comparative Example 1 | ○ | X |
| Comparative Example 2 | ○ | X |
| Comparative Example 3 | ○ | X |
| Comparative Example 4 | ○ | X |
| Comparative Example 5 | ○ | X |
| Comparative Example 6 | X | X |

From the results in Table 6, it is found that the coated conductive powders of the present invention have good electrical connection performance.

INDUSTRIAL APPLICABILITY

According to the coated conductive powder of the present invention, the aggregation of the particles of the coated conductive powder is suppressed, and a conductive adhesive that can provide highly reliable connection also for the connection of the electrodes of miniaturized electronic parts, such as IC chips, and circuit boards can be provided.

Further, the particles of the coated conductive powder are monodisperse, and therefore, they can be easily dispersed in a binder in a short time.

The invention claimed is:

1. A coated conductive powder obtained by coating the surfaces of conductive particles with insulating inorganic fine particles, wherein the volume resistivity value of the coated conductive powder is 1 Ω·cm or less, the specific gravity of the insulating inorganic fine particles is 5.0 g/ml or less, the particle diameter ratio of the insulating inorganic fine particles to the conductive particles is 1/100 or less, and the insulating inorganic fine particles adhere to the surfaces of the conductive particles, wherein the coated conductive powder satisfies $n=4\times10^4$ to $3\times10^{10}$, in the following formula:

the amount of the insulating inorganic fine particles added (g) with respect to 1 g of the conductive particles $\geq n\times(r_2^3\times d_2)/(r_1^3\times d_1)$ where n is a constant; $r_1$ is a radius of the conductive particles; $d_1$ is a specific gravity of the conductive particles; $r_2$ is a radius of the insulating inorganic fine particles; and $d_2$ is a specific gravity of the insulating inorganic fine particles.

2. The coated conductive powder according to claim 1, wherein the coating is a dry method in which the conductive particles and the insulating inorganic fine particles are dry-mixed.

3. The coated conductive powder according to claim 1, wherein the average particle diameter of the conductive particles is 0.1 to 1000 μm.

4. The coated conductive powder according to claim 1, wherein the conductive particles are particles of a metal selected from the group consisting of nickel, gold, silver, palladium, copper, and solder.

5. The coated conductive powder according to claim 1, wherein the conductive particles are plated conductive particles obtained by forming a metal coating on the surfaces of core material particles by electroless plating.

6. The coated conductive powder according to claim 5, wherein the metal coating comprises coatings of one or two or more metals selected from the group consisting of nickel, gold, silver, palladium, copper, and solder.

7. The coated conductive powder according to claim 5, wherein the metal coating is of gold or palladium.

8. The coated conductive powder according to claim 6, wherein the core material is a resin.

9. The coated conductive powder according to claim 1, wherein the insulating inorganic fine particles are of one or two or more selected from the group consisting of silica, titanium oxide, and aluminum oxide.

10. The coated conductive powder according to claim 1, wherein the insulating inorganic fine particles are fumed silica.

11. The coated conductive powder according to claim 10, wherein as the fumed silica, a fumed silica having hydrophobicity is used.

12. A conductive adhesive, comprising the coated conductive powder according to claim 1.

13. The conductive adhesive according to claim 12, used as an anisotropic conductive adhesive.

14. An IC tag, comprising the conductive adhesive according to claim 12.

* * * * *